United States Patent
German et al.

(10) Patent No.: US 6,935,022 B2
(45) Date of Patent: Aug. 30, 2005

(54) ADVANCED MICROELECTRONIC HEAT DISSIPATION PACKAGE AND METHOD FOR ITS MANUFACTURE

(75) Inventors: Randall M. German, State College, PA (US); Lye-King Tan, Singapore (SG); John Johnson, State College, PA (US)

(73) Assignee: Advanced Materials Technologies PTE, Ltd., Singapore (SG)

( * ) Notice: Subject to any disclaimer, the term of this patent is extended or adjusted under 35 U.S.C. 154(b) by 249 days.

(21) Appl. No.: 10/229,831

(22) Filed: Aug. 28, 2002

(65) Prior Publication Data
US 2003/0042006 A1 Mar. 6, 2003

Related U.S. Application Data
(60) Provisional application No. 60/315,306, filed on Aug. 28, 2001.

(51) Int. Cl.$^7$ .............................. F28F 7/00; F28D 15/00; B23P 6/00
(52) U.S. Cl. .......................... 29/890.032; 165/104.26; 165/104.33
(58) Field of Search ................ 29/890.032; 165/104.26, 165/104.33

(56) References Cited

U.S. PATENT DOCUMENTS

| | | | |
|---|---|---|---|
| 3,762,011 A | * 10/1973 | Staudhammer et al. ......... | 419/2 |
| 3,840,069 A | * 10/1974 | Fischer et al. ......... | 165/104.26 |
| 4,082,863 A | * 4/1978 | Dancy et al. ................ | 427/181 |
| 4,106,188 A | * 8/1978 | Sekhon et al. ................ | 29/887 |
| 4,274,479 A | * 6/1981 | Eastman ................ | 165/104.26 |
| 4,885,129 A | * 12/1989 | Leonard et al. ................ | 419/2 |
| H858 H | * 12/1990 | Leonard et al. ............. | 429/104 |
| H971 H | * 10/1991 | Leonard ...................... | 428/457 |
| 6,070,654 A | 6/2000 | Ito ......................... | 165/104.26 |
| 6,082,443 A | * 7/2000 | Yamamoto et al. .... | 165/104.26 |
| 6,230,407 B1 | 5/2001 | Akutsu ................... | 29/890.032 |
| 6,293,333 B1 | 9/2001 | Ponnappan et al. .... | 165/104.26 |
| 6,303,191 B1 | 10/2001 | Henne et al. ................ | 427/448 |
| 6,321,452 B1 | 11/2001 | Lin ........................ | 29/890.032 |
| 6,370,749 B1 | 4/2002 | Tseng et al. ................. | 29/33 T |
| 6,385,044 B1 | 5/2002 | Colbert et al. .............. | 361/700 |
| 6,410,982 B1 | 6/2002 | Brownell et al. ........... | 257/714 |
| 2004/0174651 A1 | * 9/2004 | Aisenbrey ................... | 361/103 |

FOREIGN PATENT DOCUMENTS

| | | | |
|---|---|---|---|
| JP | 61-008594 | * | 1/1986 |
| KR | 2001-062646 | * | 7/2001 |

OTHER PUBLICATIONS

Reimbrecht et al. Manufacturing of metallic porous structures to be used in capillary pumping systems. Mat. Res. vol. 6 No. 4 São Carlos Oct./Dec. 2003. [available]http://www-.scielo.br/scielo.php?pid=S1516–14392003000400009&script=sci_arttext&ting=en.*

(Continued)

*Primary Examiner*—Eric Compton
(74) *Attorney, Agent, or Firm*—George O. Saile; Stephen B. Ackerman

(57) ABSTRACT

Heat dissipation during the operation of integrated circuit chips is an old problem that continues to get worse. The present invention significantly ameliorates this by placing an embedded heat pipe directly beneath the chip. Using powder injection molding, the lower portion of the package is formed first as an initial green part which includes one or more cavities. The latter are then lined with a feedstock that is designed to produce a porous material after sintering, at which time a working fluid is introduced into the porous cavities and sealed, thereby forming one or more heat pipes located directly below the chip. The latter is then sealed inside an enclosure. During operation, heat generated by the chip is efficiently transferred to points outside the enclosure. A process for manufacturing the structure is also described.

20 Claims, 3 Drawing Sheets

OTHER PUBLICATIONS

Babin et al., "Steady-State Modeling and Testing of a Micro Heat Pipe," Journal of Heat Transfer, Aug. 1990. vol. 112, pp. 595–601.

Longtin et al., "A One-Dimensional Model of a Micro Heat Pipe During Steady-State Operation," Journal of Heat Transfer, Aug. 1994, vol. 116, pp. 709–715.

Larry W. Swanson, "Heat Pipes," The CRC Handbook of Thermal Engineering, F. Kreith (ed.), CRC Press, NY, 2000, pp. 4.419–4.429.

U.S. Appl. No. 09/733,527, filed Dec. 11, 2000, "Method to Form Multi-Material Components", AMT-00-002.

* cited by examiner

ADVANCED MICROELECTRONIC HEAT DISSIPATION PACKAGE AND METHOD FOR ITS MANUFACTURE

This application claims the benefit of Provisional Application No. 60/315,306, field Aug. 28, 2001.

FIELD OF THE INVENTION

The invention relates to the general field of microelectronics with particular reference to packaging and heat dissipation.

BACKGROUND OF THE INVENTION

As the world moves towards higher performance communication and computer systems, microelectronic devices are running into basic barriers related to heat dissipation. Options under exploration include active and passive packaging designs. The active designs require fans or pumps to circulate fluids for heat extraction, often leading to heat generation, power drain, and new failure modes. The alternative is to move into passive designs, such as fins to radiate heat into the enclosure.

High thermal conductivity materials are desirable for heat dissipation, and current favorites include tungsten-copper, molybdenum-copper, and aluminum or copper. The latter choices suffer from high thermal expansion coefficients which induce a new failure mechanism through thermal fatigue, associated with turning on (heating up) and turning off (cooling down) an electronic device. In order to sustain the desired thermal expansion match with silicon while maximizing thermal conductivity, the top materials then tend to be heavy, expensive, and modest in thermal conductivity. Only diamond provides a high thermal conductivity with low thermal expansion, but its cost is prohibitive.

In recent years, we have made progress in designing improved functionality into a structure through the combination of two different materials using a process termed two-material powder injection molding. This step toward functionality directly built into a device has potential benefits in microelectronic packaging. The walls might be fabricated from a good glass-sealing alloy, such as kovar, while the base would be fabricated from a low thermal expansion material, such as tungsten-copper. However, even these two-material combinations are limited by the thermal conductivity of the base. Currently, tungsten-copper is capable of thermal conductivities in the 200 W/m/K range. This is still half that possible with pure copper, but, again, still fails to satisfy the thermal expansion requirement. We note that diamond can achieve 2000 W/m/K.

As will become clear later, the present invention makes use of two-material powder injection molding to implement a different approach to this problem. This process has been described in application Ser. No. 09/733,527 Dec. 11, 2000 "Method to form multi-material components". Briefly, this process shows how powder injection molding may be used to form a continuous body having multiple parts, each of which has different physical properties such as magnetic characteristics or hardness. This is accomplished through careful control of the relative shrinkage rates of these various parts. Additionally, care is taken to ensure that only certain selected physical properties are allowed to differ between the parts while others may be altered through relatively small changes in the composition of the feedstocks used.

A routine search of the prior art was performed and the following U.S. Patents were found to be of interest: U.S. Pat. No. 6,410,982 (Brownell et al.); U.S. Pat. No. 6,321,452 (Lin); U.S. Pat. No. 6,385,044 (Colbert at al); U.S. Pat. No. 6,370,749 (Tseng et al.); U.S. Pat. No. 6,303,191 (Henne et al.); U.S. Pat. No. 6,293,333 (Ponnappan et al.); U.S. Pat. No. 6,230,407 (Akutsu); and U.S. Pat. No. 6,070,654 (Ito).

Additionally, the following publications were discovered during our search:

1. B. R. Babin, G. P. Peterson, and D. Wu, "Steady-State Modeling and Testing of a Micro Heat Pipe," *Journal of Heat Transfer*, vol. 112, August 1990, pp. 595–601.

2. J. P. Longtin, B. Badran, and F. M. Gerner, "A One-Dimensional Model of a Micro Heat Pipe During Steady State Operation," *Journal of Heat Transfer*, vol. 116, August 1994, pp. 709–715.

3. L. W. Swanson, "Heat Pipes," *The CRC Handbook of Thermal Engineering*, F. Kreith (ed.) CRC Press, N.Y., 2000, pp. 4.419–4.429.

SUMMARY OF THE INVENTION

It has been an object of at least one embodiment of the present invention to provide a heat pipe that can be cheaply produced and readily miniaturized.

Another object of at least one embodiment of the present invention has been that said heat pipe be readily made part of a package suitable for housing, and rapidly removing, heat generated by a semiconductor chip.

Still another object of at least one embodiment of the present invention has been to provide a process for manufacturing said heat pipe.

A further object of at least one embodiment of the present invention has been to provide a process for manufacturing said chip package.

These objects have been achieved by placing an embedded heat pipe directly beneath the chip. Using powder injection molding, the lower portion of the package is formed first as an initial green part which includes one or more cavities. The latter, if their dimensions exceed about 1,000 microns, are then filled with a feedstock that is designed to produce a porous material lining after sintering. Cavities with dimensions less than about 1,000 microns may be left unfilled. After sintering, a working fluid is introduced into the cavities and sealed, thereby forming one or more heat pipes located directly below the chip. The latter is sealed inside an enclosure. During operation, heat generated by the chip is efficiently transferred to points outside the enclosure. A process for manufacturing the structure is described.

DESCRIPTION OF THE PREFERRED EMBODIMENTS

Figure 1:
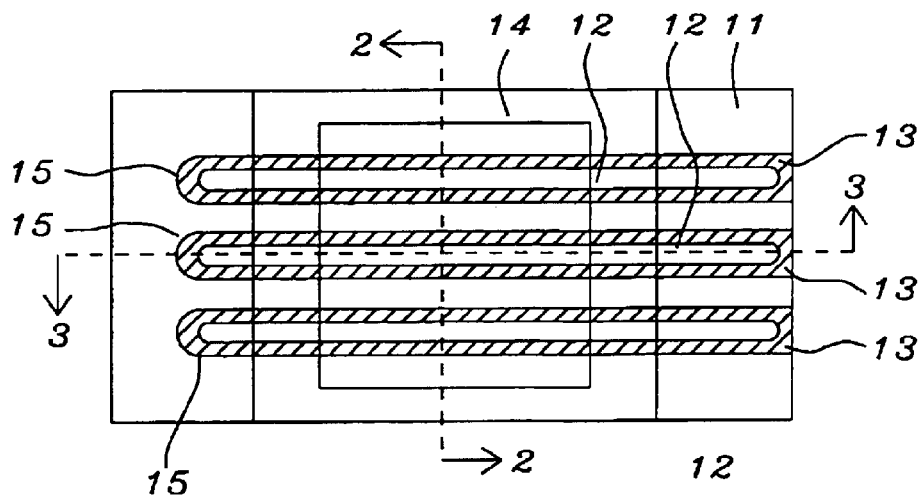
FIG. 1 is a plan view of the structure of the present invention.

The present invention discloses a novel functional design that is material based on selective porosity embedded at desired locations in a microelectronic package. These are placed directly in the microelectronic package under the semiconductor chip to afford the greatest heat dissipation. The purpose of the selective porosity is to enable wicking of the condensed working fluid, such as alcohol or water, from a cold region back to a hot region. The liquid phase evaporates from the hot region, thereby consuming the enthalpy (heat content) of evaporation. The vapor now migrates through a channel to a cold region where it redeposits the enthalpy via condensation. Such behavior is well known as heat pipe technology, such heat pipes being used as structures for the transport of heat via evaporation and condensation of a working fluid in a porous pipe or wick. Heat pipes can deliver from 50,000 to 200,000 W/m/K in equivalent thermal conductivity.

Structures of the type described above are relatively expensive and not well suited for incorporation in a microelectronic packaging scheme. The present invention teaches how two-material injection molding technology can be applied to the fabrication of high heat dissipation microelectronic packages. This is achieved by first injection molding the housing with cavities located in appropriate places. One means for achieving this goal would be to use a sacrificial material insert in the mold, but a preferred means is to use. the two-color metal powder injection molding technology already known to AMT.

In this latter case, hard tooling inserts form the cooling pattern during the first molding. In the second stage of injection molding, a low packing density powder feedstock is injection molded into the pattern of the heat pipe located in the overall package. Controlled porosity and pore size are possible by selection of the proper metal powder size and powder to polymer ratio. Additional control can be achieved by inclusion of sacrificial particles in the feedstock. The latter route provides precise control over the pore size and porosity, independent of the metal powder size, since the concentration and size of the sacrificial particles are independently controlled when batching the feedstock.

After the second step in injection molding, the component is subjected to normal debinding and sintering cycles. After sintering, the second material regions will be incompletely sintered, leaving behind the desired porosity and pores for the eventual creation of high thermal conductivity heat pipes. A working fluid is then dosed into the pores and the pore channels sealed by solder, plugging, or other mechanical or standard means. Since heat pipes dissipate 100 times more heat than diamond, the resulting microelectronic packages can far exceed what can be attained with current designs.

The approach taken by the present invention allows the fabrication of more complicated patterns, including curved and conformal cooling passages. Additionally, the present invention allows the fabrication of lightweight devices from aluminum or other low-density materials for portable devices, such as cellular telephones and laptop computers.

We will describe the present invention in terms of a process for its manufacture. This description will also further clarify the structure of the present invention. Referring now to FIG. 1, shown there is a plan view of the structure. Its principal parts are a solid body 11 within which there are cavities such as 12. These cavities have been lined with porous material 15 which is saturated with a working fluid. The unfilled portions of the cavities are open vapor channels.

The manufacturing process starts with the preparation of a feedstock made up of particles of the material from which solid body 11 is to be constructed, as well as a suitable binder (and possibly, for some materials, a fluxing agent). Suitable materials for these particles include, but are not limited to, copper, aluminum, tungsten, tungsten-copper, kovar, stainless steel, or nickel alloys. The particles are carefully chosen for their ability to sinter densify to near 100% of the materials theoretical density. Generally, this requires a mean particle size less than 30 $\mu$m, but is material dependent. For example, tungsten-based materials generally require a mean particle size less 5 $\mu$m. Suitable binder materials include combinations of waxes, organic polymers, and surface active agents, such as stearic acid. These binders are melted and the particles are uniformly dispersed within them. Typically, the particles compose 50–65 percent of the total volume of feedstock while the binder composes the rest.

Prior to injection of the feedstock, inserts are added to the mold. These have the shape of the cavities 12 that are to be formed and are placed in the appropriate locations. At this stage, the cavities will always have at least one open end although more complicated designs may require two or more open ends per cavity. Typically, a simple straight cavity as exemplified by 12 in the figures would be between about 2 and 8 mm wide, 2 and 5 mm deep, and between 12 and 60 mm long. The inserts may be made of sacrificial materials such as organic polymers, including polyethylene, polypropylene, and polystyrene, so that the cavity is formed when they are removed through liquefaction, vaporization, or chemical action, or they may be made out of materials, such as bronze, steel, or alumina, which allows them to be removed intact for later reuse. The latter type of insert is to be preferred, for economic reasons, unless the shape of the cavity is such, that the insert cannot be removed without changing the cavity's shape. With the feedstock heated and the insert(s) in place, molding under pressure takes place, resulting in the formation of the initial green body.

Cavities with dimensions greater than about 1000 $\mu$m in the green body are now partially filled with a second feedstock which was previously prepared from particles having a mean diameter between about 40 and 200 $\mu$m, uniformly dispersed within a suitable binder. Suitable materials for these particles include, but are not limited to copper, aluminum, tungsten, tungsten-copper, kovar, stainless steel, or nickel alloys. The larger size of the particles here ensures that the material that will be obtained after sintering will be porous. An additional degree of pore size control may be achieved by adding to the second feedstock particles of a sacrificial material such as graphite, which evacuates the structure during sintering, leaving behind voids. Typically, the volume fraction of the non-sacrificial particles in the mix is 30–40 percent of the total volume of the feedstock.

Prior to injection of the second feedstock, a second set of inserts are added to the green body. These have the shape of the vapor channels within the cavities 12 that are to be left open. They may be made out of the same types of sacrificial or reusable materials as the first set of inserts. With the second feedstock heated and the initial green body with insert(s) in place, a second molding under pressure takes place, resulting in the formation of the final green body. Cavities with dimensions less than about 1000 $\mu$m can be left unfilled.

The process now continues with routine removal of all binding materials from the final green body resulting in the formation of a skeleton structure. The latter is then sintered to form the final body. The step of sintering consists of heating at a temperature and time and in an atmosphere that depends on the composition of the body. For example, a copper body is sintered at a temperature between about 900 and 1070° C. for between 5 and 120 minutes in an atmosphere of hydrogen. Note that an important feature of the process (though not part of the present invention) is the control of the nature and concentration of the various binders used to form the feedstocks so as to ensure that porous and dense portions of the structure shrink by the same amount during sintering. Details about this aspect of the invention can be found in the aforementioned application Ser. No. 09/733,527 filed Dec. 11, 2000.

The next step is the introduction of a working fluid into the cavity so that it may function as a wick. The working fluid must have a triple point below its operational temperature and a critical point above its operational temperature. Typically, the working fluid will have a triple point below 20° C. and a critical point above 100° C. Examples of liquids suitable for use as a working fluid include, but are not limited to, water, ammonia, acetone, and alcohol. The working fluid occupies enough of the cavity volume to saturate the wick. This is accomplished by first evacuating the cavity under vacuum, charging the cavity with the fluid, then sealing all open ends with plugs 13, thereby forming the heat pipe. Possible ways to seal the cavities include, but are not limited to, epoxying, welding, crimping, soldering, and press fitting.

Figure 2:
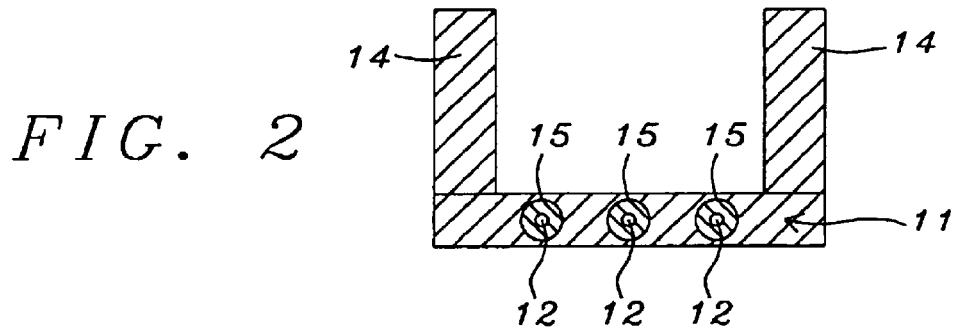
FIGS. 2 and 3 are cross-sections through two different planes of the structure seen in FIG. 1.
Figure 3:
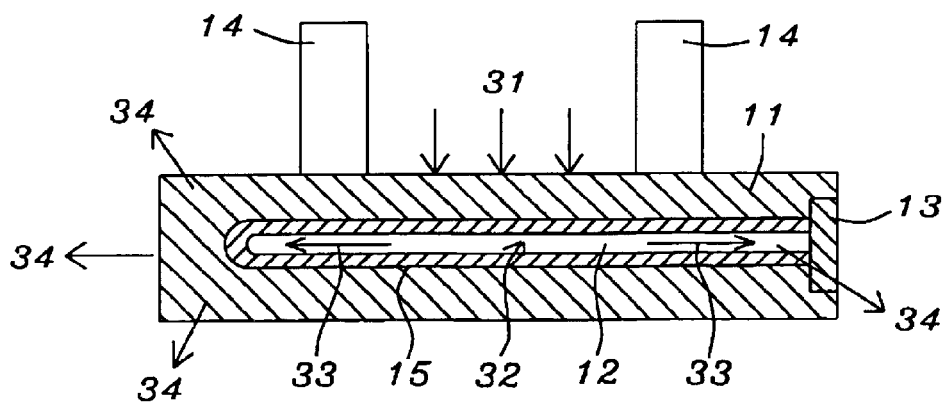

Enclosure 14 is then formed on the upper surface of body 11. This is best seen in FIG. 2 which is a cross-section taken through 2—2 in FIG. 1. Enclosure 14 is placed directly over one or more of the heat pipes. Cross-section 3—3 can be viewed in FIG. 3 which also shows the direction of heat flow. Starting at hot spot 31 (generally the underside of a chip) heat is transferred by conduction through solid body 11 to the porous wick 32 where it causes the working fluid to evaporate and expand along the vapor space in directions 33, carrying the heat with it. Once the hot vapor passes outside the sphere of influence of hot spot 31 it condenses back to liquid, as symbolized by arrows 34. As the liquid concentration builds up there, capillary forces draw it back through the porous wick 32 toward hot spot 31 where the cycle can begin again.

Figure 4:
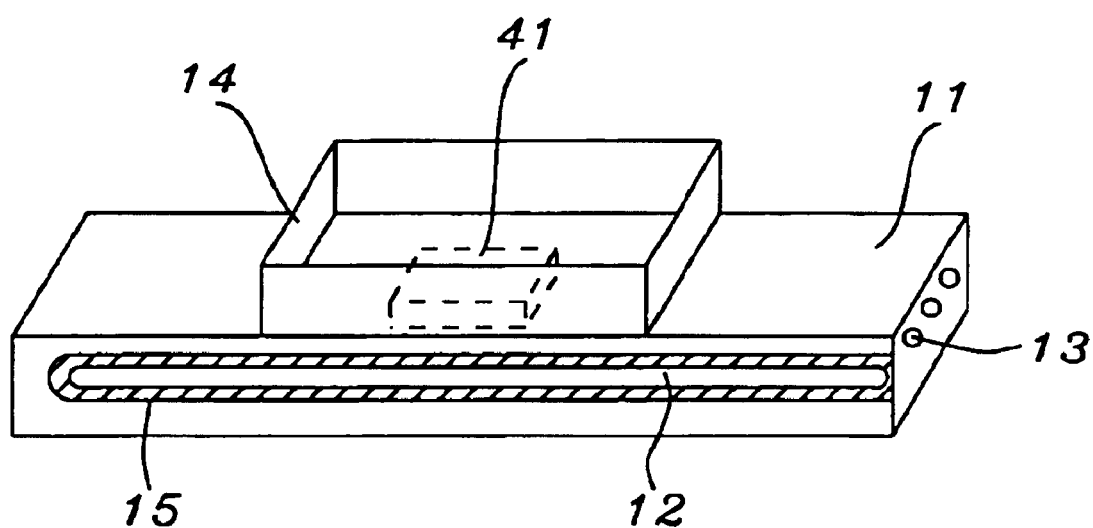
FIG. 4 is an isometric representation of FIGS. 1, 2, and 3.

The process concludes with the step of mounting the chip on the upper surface of body 11, using a high thermal conductivity medium, such as silver-filled epoxy, followed by sealing of enclosure 12 (with the chip inside it). Optionally, a high conductivity material such as helium may be sealed inside 14 together with the chip. FIG. 4 is an isometric view of the structure showing a chip 41 in place inside enclosure 14. Not shown in FIG. 4 are contact pads, formed inside enclosure 14 to receive chip 41, together with leads, connected to these contact pads that extend away from the chip to terminate outside the enclosure.

EXAMPLE

A 99.85% pure copper powder with a mean particle size of 15 μm is mixed with an organic binder composed of paraffin wax, micropulver wax, polyethylene, and stearic acid to form a first feedstock. Said 15 μm copper powder comprises 50 volume percent of the said first feedstock. A 99.88% pure copper powder with a mean particle size of 50 μm is mixed with the same binder composition to form a second feedstock. Said 50 μm copper powder comprises 35 vol. % of the said second feedstock. The first feedstock is molded into the shape of a cylindrical housing measuring 18 mm long and 12.5 mm in diameter.

A cylindrical steel insert forms a cavity measuring 16 mm long and 5 mm in diameter. A 16 mm long and 3 mm in diameter insert consisting of polyethylene and 20% paraffin wax is then added to the cavity of the green housing and the second feedstock is molded into the open portion of the cavity. The green body is freed of all organic binder by heating in a controlled furnace over a period of 25 hours at 600° C. in a hydrogen atmosphere. The debound body is heated to 1050° C. at a rate of 350° C./hr in a hydrogen atmosphere. After sintering at 1050° C. for two hours, the furnace is allowed to cool. This results in a housing with a density of about 8.6 g/cm$^3$, which is close to its theoretical density, and a porous layer within the housing with a density of about 60% of theoretical.

Figure 5:
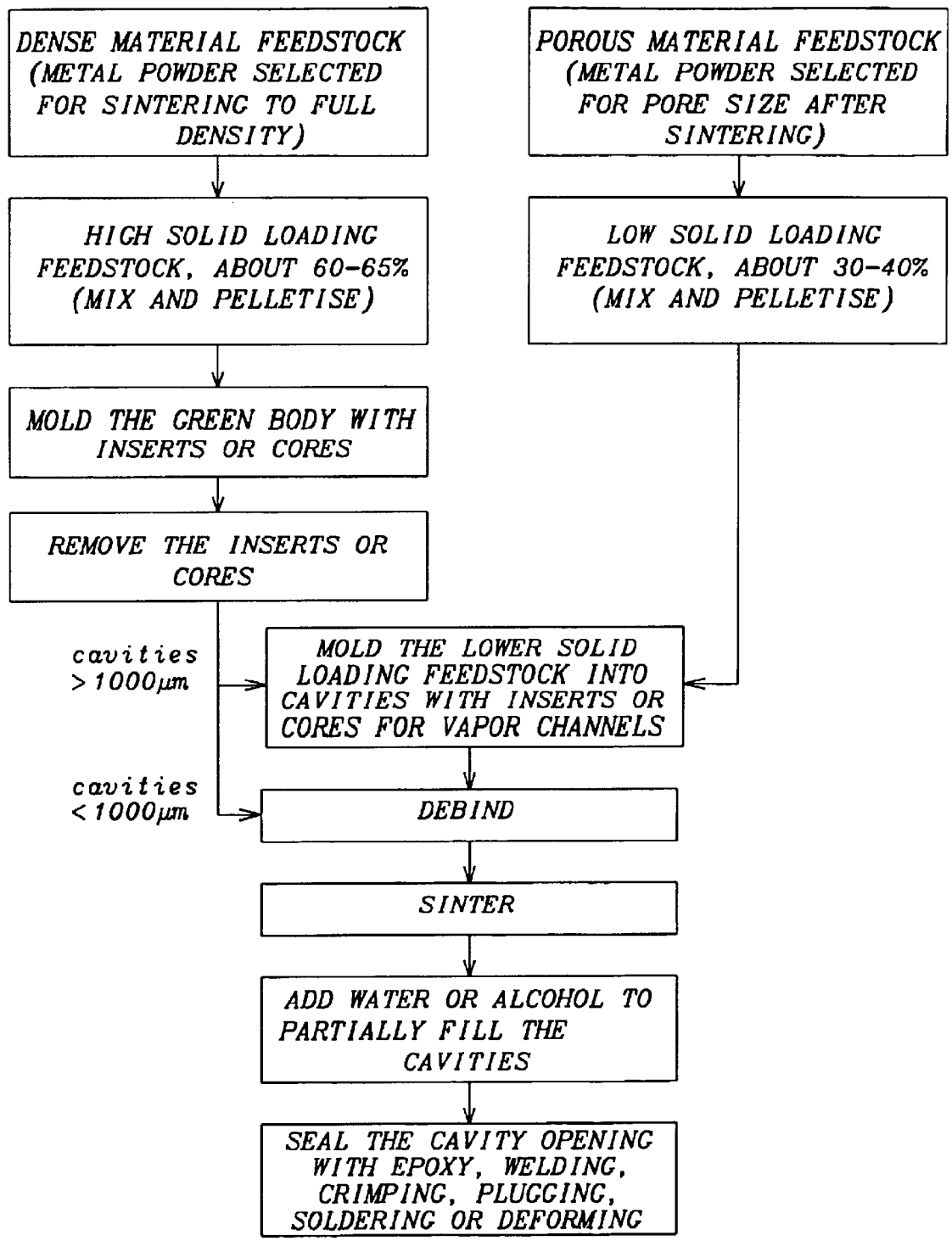
FIG. 5 is a flow chart summarizing the principal steps of the process of the present invention.

Good bonding is observed between the porous layer and housing surface. This housing can then be charged with water and sealed for operation as a heat pipe for removing heat from a semiconductor chip, placed in an enclosure on one end of the cylindrical structure. The effectiveness of this design for power dissipation was confirmed by calculations that show that, at a nominal operating temperature of 40° C., the package is capable of transporting over 100 W of waste heat away from the chip. A flow chart for the above process in presented in FIG. 5.

What is claimed is:

1. A process to manufacture a heat pipe, comprising:

providing a first feedstock, having a first volume, that further comprises first particles, having a mean diameter less than about 30 microns, uniformly dispersed within a first binder, said first particles occupying between about 50 and 65% of said first volume;

providing a second feedstock, having a second volume, that further comprises second particles, having a mean diameter between about 40 and 200 microns, uniformly dispersed within a second binder, said second particles occupying between about 30 and 40% of said second volume;

molding said first feedstock around a first insert to form a green body;

then removing said first insert from the green body thereby forming, in the green body, a cavity having one closed end and one open end;

adding a second insert to said cavity;

filling said cavity with said second feedstock;

removing all binding materials from said green body and from said second feedstock inside said cavity, thereby forming a first skeleton within which is a second skeleton that is more porous than said first skeleton;

sintering said first and second skeletons, thereby forming a dense body that includes an interior wick;

introducing a working fluid into said wick; and then sealing said open end, thereby forming said heat pipe.

2. The process described in claim 1 wherein said first particles are selected from the group consisting of copper, aluminum, tungsten, tungsten-copper, kovar, stainless steel, and nickel alloys.

3. The process described in claim 1 wherein said second particles are selected from the group consisting of copper, aluminum, tungsten, tungsten-copper, kovar, stainless steel, and nickel alloys.

4. The process described in claim 1 wherein said second particles are removed from within said cavity during the step of sintering the skeletons.

5. The process described in claim 1 wherein the step of removing said first insert from the green body further comprises destruction of said first insert.

6. The process described in claim 1 wherein said first insert is selected from the group consisting of bronze, steel, and alumina.

7. The process described in claim 1 wherein said first insert may be reused after the termination of said process.

8. The process described in claim 1 wherein said working fluid is selected from the group consisting of water, ammonia, acetone, and alcohol.

9. A process to manufacture a package containing a heat pipe, comprising:

provided a first feedstock, having a first volume, that further comprises first particles, having a mean diameter less than about 30 microns, uniformly dispersed within a first binder, said first particles occupying between about 50 and 65% of said first volume;

providing a second feedstock, having a second volume, that further comprises second particles, having a mean diameter between about 40 and 200 microns, uniformly dispersed within a second binder, said second particles occupying between about 30 and 40% of said second volume;

molding said first feedstock around a first insert to form a green body;

then removing said first insert from the green body thereby forming, in the green body, a cavity having one closed end and one open end;

adding a second insert to said cavity;

filling said cavity with said second feedstock;

removing all binding materials from said green body and from said second feedstock inside said cavity, thereby forming a first skeleton within which is a second skeleton that is more porous than said first skeleton;

sintering said first and second skeletons, thereby forming a dense body that includes an interior wick;

introducing a working fluid into said wick;

then sealing said open end, thereby forming said heat pipe;

on a surface of said package, forming an open enclosure that is overlapped by said heat pipe;

then mounting said integrated circuit chip inside said enclosure on said surface using a high thermal conductivity medium; and then sealing said enclosure.

10. The process described in claim 9 wherein said first particles are selected from the group consisting of copper, aluminum, tungsten, tungsten-copper, kovar, stainless steel, and nickel alloys.

11. The process described in claim 9 wherein said second particles are selected from the group consisting of copper, aluminum, tungsten, tungsten-copper, kovar, stainless steel, and nickel alloys.

12. The process described in claim 9 wherein said second particles are removed from within said cavity during the step of sintering the skeletons.

13. The process described in claim 9 wherein the step of removing said first insert from the green body further comprises destruction of said first insert.

14. The process described in claim 9 wherein said first insert is selected from the group consisting of bronze, steel, and alumina.

15. The process described in claim 9 wherein said first insert may be reused after the termination of said process.

16. The process described in claim 9 wherein said working fluid is selected from the group consisting of water, ammonia, acetone, and alcohol.

17. The process described in claim 9 wherein said high thermal conductivity medium is helium.

18. The process described in claim 9 further comprising forming, within said enclosure, contact pads and leads, connected to said contact pads, that terminate outside said enclosure.

19. The process described in claim 9 wherein a high thermal conductivity material is sealed inside said enclosure together with said chip.

20. A process to manufacture a package containing a heat pipe, comprising:

providing a feedstock, having a volume, that further comprises particles, having a mean diameter less than about 30 microns, uniformly dispersed within a binder, said particles occupying between about 50 and 65% of said volume;

molding said feedstock around an insert to form a green body;

then removing said insert from the green body thereby forming, in the green body, a cavity having one closed end and one open end and dimensions less than about 1,000 microns;

removing all binding materials from said green body, thereby forming a skeleton within which is a microchannel capable of functioning as a wick;

sintering said skeleton thereby forming a dense body that includes said wick;

introducing a working fluid into said wick;

then sealing said open end, thereby forming said heat pipe;

on a surface of said package, forming an open enclosure that is overlapped by said heat pipe;

then mounting said integrated circuit chip inside said enclosure on said surface using a high thermal conductivity medium; and then sealing said enclosure.

* * * * *